United States Patent [19]

Kurczewski

[11] Patent Number: 5,057,777
[45] Date of Patent: Oct. 15, 1991

[54] QUADRATURE COIL CONSTRUCTION

[75] Inventor: Richard V. Kurczewski, Monroe, Conn.

[73] Assignee: North American Philips Corporation, New York, N.Y.

[21] Appl. No.: 514,906

[22] Filed: Apr. 26, 1990

[51] Int. Cl.$^5$ ............................................. G01R 33/20
[52] U.S. Cl. ..................................... 324/318; 324/322
[58] Field of Search .............. 324/318, 322, 307, 309, 324/314; 128/653 A; 333/219, 20

[56] References Cited

U.S. PATENT DOCUMENTS

| 4,695,801 | 9/1987 | Arakawa et al. | 324/318 |
| 4,766,383 | 8/1988 | Fox et al. | 324/318 |
| 4,783,629 | 11/1988 | Arakawa et al. | 324/322 |
| 4,816,765 | 3/1989 | Boskamp | 324/318 |
| 4,879,516 | 11/1989 | Mehdizadeh et al. | 324/318 |

OTHER PUBLICATIONS

Partain, Price, Patton, Kulkarni, and James, "Radio Frequency Resonators", Magnetic Resonance Imaging, 2nd Edition, 1988, pp. 1194–1198.

Primary Examiner—Hezron E. Williams
Assistant Examiner—Louis M. Arana
Attorney, Agent, or Firm—William Squire

[57] ABSTRACT

A coil system particularly for a wrist for use in an NMR imaging system comprises first and second planar U-shaped rectangular parallel coils. The extended legs of the U-shapes are interconnected to form third and fourth rectangular U-shaped planar coils oriented normal to the plane of the first and second coils to form a rectangular polyhedron coil configuration. A support arrangement for the coils receives a wrist to be imaged and assists in aligning the wrist relative to a body coil of the NMR system. Impedance matching and tuning circuits selectively apply and receive signals from the coils in quadrature.

19 Claims, 3 Drawing Sheets

QUADRATURE COIL CONSTRUCTION

This invention relates to a quadrature coil construction and, more particularly, to a coil construction for use in NMR imaging a human limb.

Of interest is copending application Ser. No. 483,187 filed Feb. 20, 1990 entitled "Quadrature Surface Coil Construction for Magnetic Resonance Imaging Apparatus" in the name of Boskamp et al. and assigned to the assignee of the present invention.

In NMR systems, a body coil receives a patient therein and generates a magnetic field along the patient axis, the patient usually lying on a table in the body coil. A number of different types of local coils of smaller size are placed adjacent parts of the patient of interest for use in imaging such parts. The coils also may be of the surface type, generally planar coils, flexible or rigid, so called bird cage coils and others. The coils may be operated in linear or quadrature modes. The different coils are used to examine different regions of the body, each coil having a specialized application. For example, in U.S. Pat. No. 4,816,765, a detection coil is disclosed comprising a stack of two coils. Such coils may be used as transmitters of RF pulses and as antenna receivers.

One area that has been particularly troublesome are wrist coils. A patient typically lies prone or supine on the patient table in the body coil. A linear surface coil is typically used to examine different parts of the body including wrists. A linear surface coil is not operated in quadrature and does not have as good a signal-to-noise ratio (SNR) as quadrature coils. Surface coils are flexible, can be bent to conform to the area under examination and then tuned for each patient with a specified tuning procedure. This is cumbersome and tedious. Quadrature coils provide improved SNR and generally are more complex to operate and not generally used for specific body parts, in particular, wrists.

A crossed ellipses coil, for example, is described in Magnetic Resonance Imaging Volume II second edition, Partain et al., 1988 Saunders Company pages 1194–1198, operates in quadrature and provides a desirable uniform field. Such coils are supported in a rigid housing having an aperture through which a wrist could be inserted during imaging, although this application is not generally known. It is essential that the coils be placed as close as possible to the magnetic field isocenter in the body coil. The body coil includes an elongated cylindrical housing which surrounds the patient during the imaging procedure. The crossed ellipses structure if employed to examine a wrist would receive the patient's wrist therethrough while the patient is in the body coil. The resulting combination of structures in practice is difficult and awkward to implement.

The reason for this is that the body coil has a relatively small internal diameter for receiving the patient. When the patient lies supine, in one arrangement, the coil enclosed wrist would be placed above the chest. The coil can not rest on the chest due to breathing motion of the chest which interferes with the imaging. Therefore the coil structure needs to be suspended from the body coil structure above the chest. This removes the coil from the isocenter of the body coil magnet reducing the effectiveness of the coil. Also, the crossed ellipses structure has a height sufficiently great which may interfere with the internal walls of the body coil structure.

Another alternative orientation is for the patient to lie prone. In this orientation, the patient lies on his belly with the wrist coil and arm above his head and resting on the table. However, it is required that the crossed ellipses field orientations be parallel and orthogonal to the body coil field which extends along the patient's length. This orientation requires the forearm to extend normal to the body coil field, i.e., normal to the patient's length and body coil field. This properly orients the crossed ellipses fields relative to the body coil field. The problem with the latter is that the patient's elbow may abut the inside wall of the body coil causing the wrist coil to be off center. Further, it is very uncomfortable for a person to lay with the forearm normal to his body length.

The present invention is directed to solve the above problems. The present inventor recognize a need for a wrist coil that is comfortable to use, need not be retuned for each patient, is simple to align to the body coil and yet has good signal to noise (SNR) characteristics. Also, it is desired that such coils be implemented for quadrature operation for enhancing the SNR characteristics of the coil.

A quadrature coil construction for use in an NMR imaging apparatus comprises first and second spaced U-shaped electrically conductive coils lying in parallel planes. Interconnect means conductively connect the coils to form therewith third and fourth U-shaped coils oriented orthogonal to the first and second coils. Signal applying means apply radio frequency signals to the coils in quadrature and receive signals generated by the coils in response to sensing orthogonal magnetic fields. By making the coils relatively planar the height of the coils is reduced as compared to crossed ellipses and further permits a prone patient to orient his arm at a more natural 45 degree angle relative to his body over his head while correctly orienting the field orientation of the coils to the body coil magnet field without cross coupling the fields of the wrist coils.

IN THE DRAWING

Figure 1:
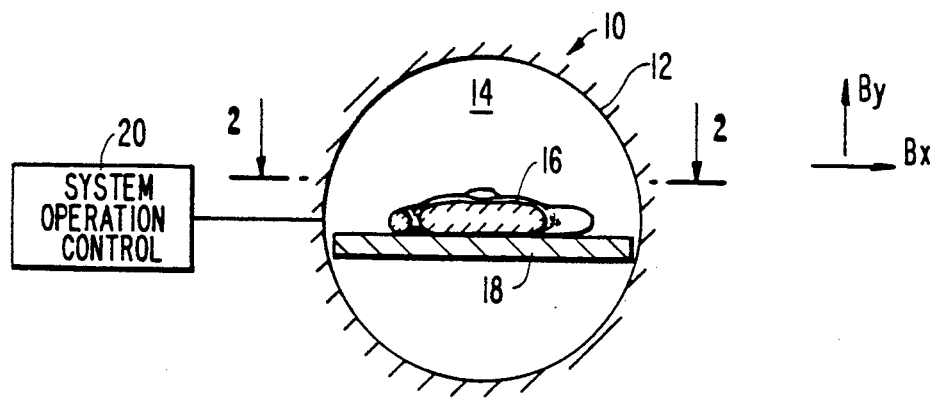
FIG. 1 is an end diagrammatic sectional elevation view of an NMR imaging system.

In FIG. 1, a body coil system 10 includes a structure 12 having a circular cylindrical cavity 14 for receiving a patient 16 laying on a table 18. A system operation control 20 operates the NMR system for imaging selected parts of the patient 16 in known ways by creating a magnetic field in cavity 14, applying RF pulses to certain coils in the system and then sensing magnetic fields generated by the pulses for creating images of the selected parts. For example, reference is made to U.S. Pat. No. 4,816,765, incorporated by reference herein for a detailed description of such an imaging system.

Figure 2:
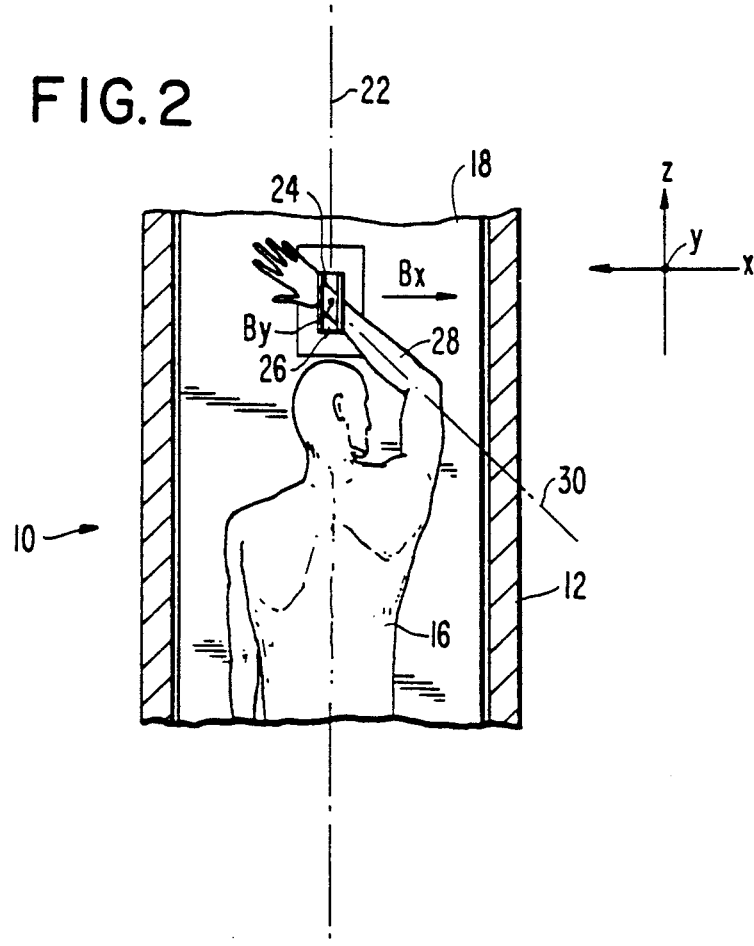
FIG. 2 is a plan sectional view of the system of FIG. 1 taken along lines 2—2 in accordance with one embodiment of the present invention.

In FIG. 2, a patient 16 lies on table 18 along system axis 22. The diameter of the cavity 14 normal to axis 22 is just sufficiently large to receive the patient therein. To image the patient's wrist 24, a wrist coil assembly 26 according to one embodiment of the present invention is releasably secured to table 18 at the isocenter of the magnetic field generated by system 10 on axis 22. In this position the fields Bx and By lie in a plane normal to axis 22 wherein the flux of the body coil of apparatus 10 is parallel to axis 22. As shown, the patient's forearm 28 is aligned on axis 30 which as about 45 degrees to the perpendicular to axis 22. The patient in this position lies prone, is comfortable and able to keep the wrist still during imaging. As will be explained the coil assembly 26 aligns the wrist in this 45 degree position and is relatively simple to set up. Further, the assembly assists the patient in keeping the wrist still during imaging by releasably securing the wrist in place.

Figure 3:
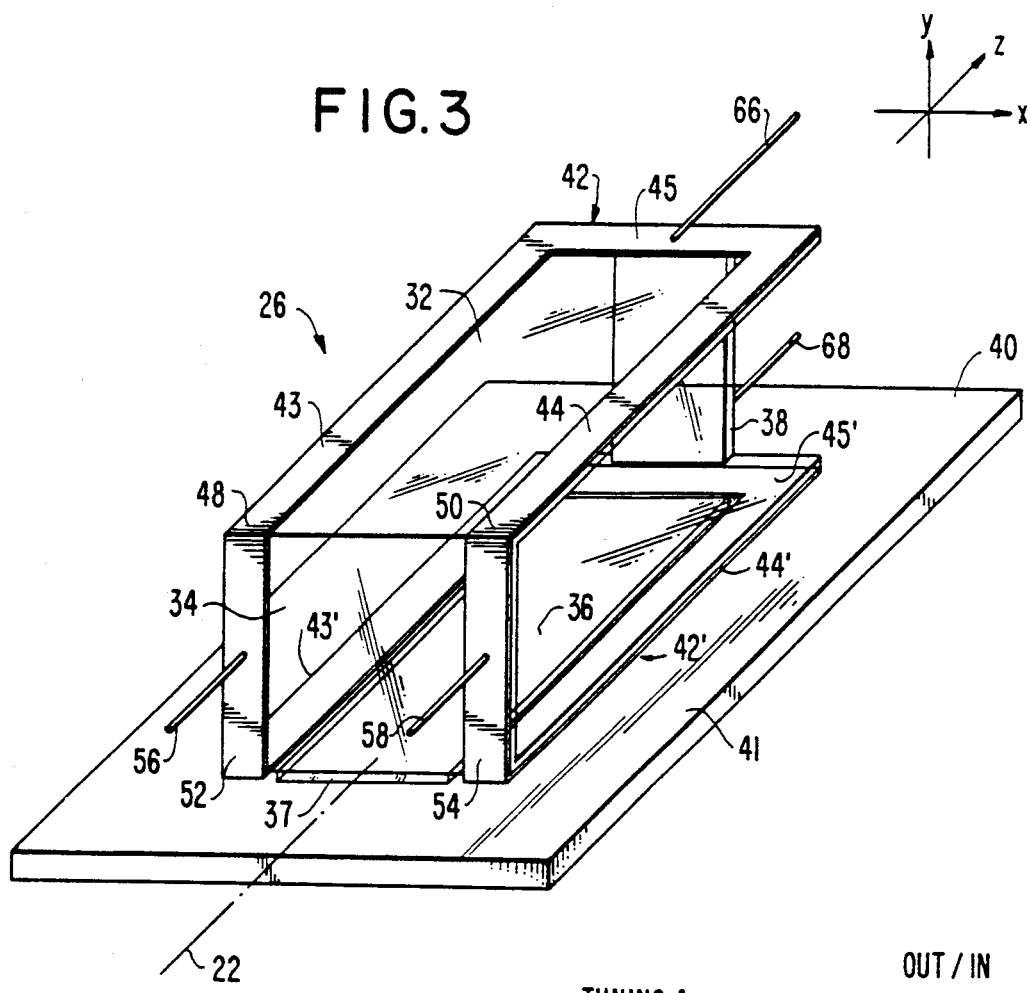
FIG. 3 is an isometric view of a wrist coil of the embodiment of FIG. 2.

In FIG. 3, assembly 26 comprises magnetic field transparent support sheet members 32, 34, 36, 38 and 40. Preferably, the sheet members may be polycarbonate material or other thermoplastic or thermosetting plastic materials or equivalents. This material is relatively rigid and in the form shown may be transparent to visible light. Members 32 and 36 are parallel and preferably identical in dimension and are, for example, 8×12 cm. in transverse width normal to axis 22 and length parallel to axis 22, respectively. Members 34 and 38 are parallel and attached to members 32 and 36 at their respective ends as shown. Member 38 supports members 32 and 36 at that end. However, the member 38, is about one half the width of member 34 and centrally positioned at the ends of members 32 and 36. The members have a thickness sufficient to provide a relatively rigid structure, for example, about 0.5 to 1 cm. Member 34 is about 8 cm. in transverse width and 6 cm. in height. Member 38 is about 3 cm. in width and 8 cm. in height. The height of this assembly is about one half the height of a crossed ellipses assembly discussed in the introductory portion above. Thus, assembly 26 is considerably less obtrusive in use having a much smaller volume than the crossed ellipses assembly. The bottom member 42' is bonded or otherwise secured to a support plate 41 via an intermediate plate 37 also of radiation transparent material. Plate 37 spaces conductor 42' from plate 41. Plate 41 is releasably secured to table 18, FIG. 1, by double faced adhesive tape or the like on the underside thereof and easily permits alignment of the assembly 26 to axis 22 and to a given patient.

The coil comprises a U-shaped conductor 42 generally in tape form, bonded to and over member 32 and an identical conductor 42' bonded to and over member 36 on the lower side thereof in the drawing. Representative conductor 42 comprises a planar electrically conductive layer having two straight legs 43 and 44 connected by a base member 45 at one end of the legs. Member 45 is normal to legs 43 and 44. Conductor 42 is juxtaposed parallel to and spaced from conductor 42' aligned in the y direction with their corresponding legs and base member over one another. Respective ends 48 and 50 of legs 43 and 44 are each electrically conductively connected to a different end of respective planar parallel electrically conductive layers of straight conductors 52 and 54 bonded to member 34. The opposing ends of conductors 52 and 54 are electrically conductively connected to the corresponding ends of the respective legs 43' and 44' of conductor 42'. The coils 42 and 42' and conductors 52 and 54 form a rectangular polyhedron. Elements with primed reference numerals are identical to elements with unprimed reference numerals.

Figure 4:
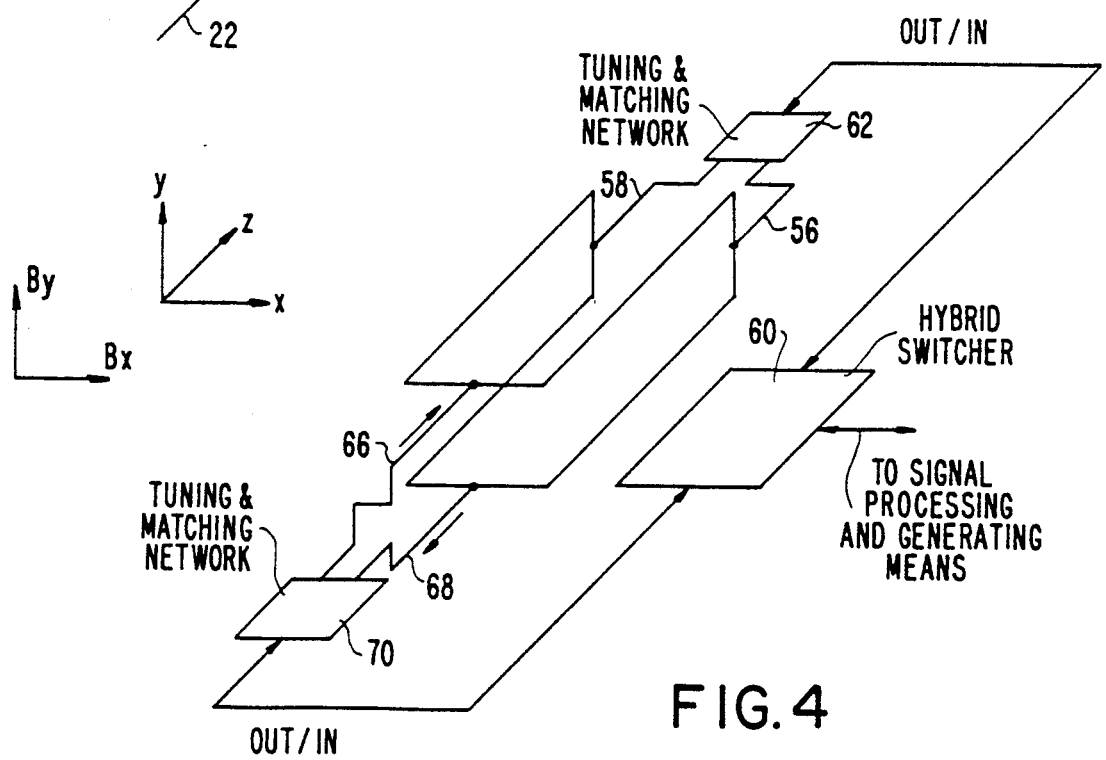
FIG. 4 is a schematic representation of the wrist coils of FIGS. 2 and 3 showing in more detail the layout of the conductive coils.

A pair of conductive wires 56 and 58 are connected to the center of respective different ones of interconnect conductors 52 and 54 for connection to the system signal processing and generating means (not shown), FIG. 4, via hybred switcher 60 and impedance matching and tuning network 62. A pair of conductive wires 66 and 68 are connected to the center of respective different ones of conductor members 45 and 45' at the opposite end of the structure. Wires 66 and 68 are connected to the system signal processing and generating means (not shown) via hybred switcher 60 and impedance matching and tuning network 70, FIG. 4. The networks 62 and 70 include components for tuning the coils for operation at the same desired radio frequency and for matching the impedances of the coils to the impedance of the cables carrying the signals to and from the coils to the signal processing and generating means. Not shown are traps for decoupling the input/output cables to the matching and tuning networks.

In FIG. 4, radio frequency (rf) pulses are applied to networks 62 and 70 via hybrid switcher 60 in a transmit mode from a signal processing and generating means (not shown). In a receive mode the signal processing and generating means receives rf pulses generated by assembly 26 via networks 62 and 70 and switcher 60. Switcher 60 combines the received 90 degree phase shifted rf pulses generated by the assembly 26. Switcher 60 phase shifts by 90 degrees the signals received from the signal generating means and applies the phase shifted signals to the networks 62 and 70. Imaging means (not shown) generate a display from the signals applied to the signal processing and generating means from assembly 26. The switcher includes PIN diodes (not shown) for performing the combining and phase shift functions in a known way. Thus the switcher in the transmit mode splits the received pulse into sine - cosine functions and applies the split functions to assembly 26 in quadrature. The reverse operation occurs in the receive mode. The assembly 26 generates magnetic fields in the transmit mode and produces currents induced in the coils in the receive mode by the resultant magnetic fields created by the object under examination in typical NMR fashion.

Figures 5A, 5B, 6:
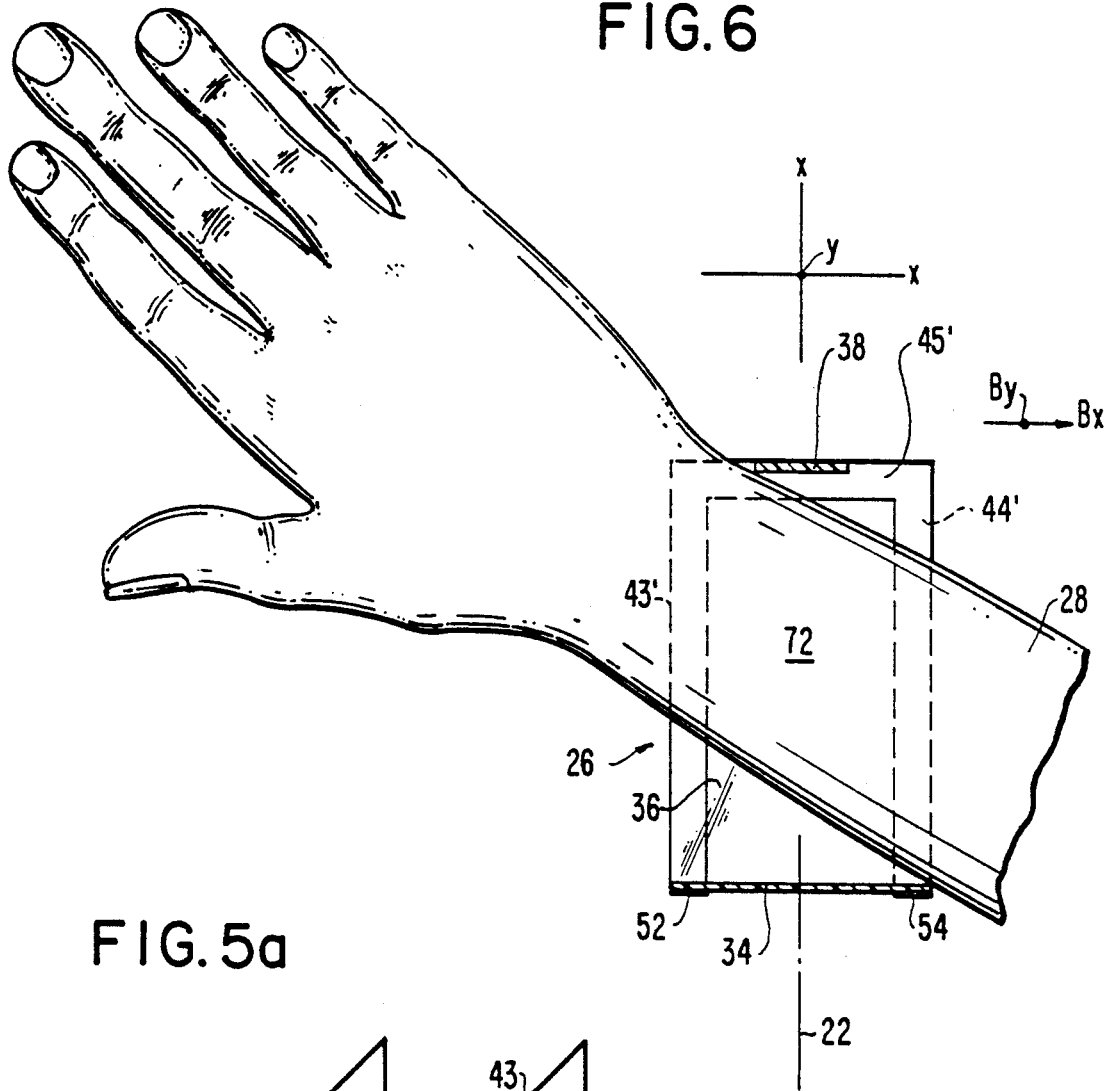
FIGS. 5a and 5b are diagrams showing the current flow in the coils of FIG. 3 when quadrature radio frequency signals are applied to the coil structure.
FIG. 6 is a plan view of the coil of FIG. 3 showing a wrist in place during imaging.

The coils operate in quadrature as follows. Assume an rf pulse is applied to wires 66 and 68 and a current flows in the direction of the arrows, it being understood that currents flow in the conductors in both directions. FIG. 5a shows by the arrows the direction of the current flow in the conductors 42 and 42'. Legs 44 and 44' and conductor 54 form a first coil and legs 43 and 43' and conductor 52 form a second coil for this current creating flux Bx in a horizontal mode parallel to the patient table. In the same sense, flux in the Bx direction creates a current in these coils which current flows to wires 66 and 68.

In FIG. 5b, assume a current is applied to wires 56 and 58 in the direction of the arrows. A first current flows in a coil formed by legs 43 and 44 and base member 45 of conductor 42 in the direction of the arrow adjacent these conductors. A second current flows in a coil formed by legs 43' and 44' and base member 45' of conductor 42' creating flux By in a direction normal to flux Bx of FIG. 5a. In the converse, flux By induces a current in the latter coil. The coils of FIG. 5b thus are normal to the coils of FIG. 5a.

The resulting currents are applied to switcher 60, FIG. 4, via respective networks 70 and 62. The currents are 90 degrees out of phase and are phase shifted into phase by switcher 60 to combine the signal which is then applied to. the signal processing and generating means for eventual imaging. The converse occurs when 90 degree out of phase rf pulses are applied to the coils in the form of currents in the direction of the arrows of FIGS. 5a and 5b. These currents create quadrature magnetic fields at the isocenter of the assembly 26 coils.

Tests conducted on the coils of the present invention as compared to crossed ellipses coils showed respective SNR of about 185.7 and 156 indicating the coils of the present invention perform superior even to crossed ellipses coils which have been preferable in the prior art. The measurements were made under comparable test conditions at the center of the coils.

The coils of the present invention surprisingly showed superior characteristics for use in an NMR imaging system while at the same time providing improved comfort to the patient. What is surprising is that the coils are planar rather than circular as in crossed ellipses. It is not believed known that planar orthogonal coils could operate in quadrature even better than crossed ellipses.

In FIG. 6, a wrist 72 is shown aligned by the assembly 26. The hand of the patient is passed through the cavity of the assembly to the position shown. In this position, one side of the wrist abuts the adjacent edge of member 38. By making member 38 narrower in width than member 34 the assembly can only be conveniently positioned in the correct orientation in one way. The other side of the wrist abuts the adjacent edge of member 34. These members automatically define the desired 45 degree angle of the forearm 28 of the patient when the coils of the assembly are aligned to axis 22 of the system 10. In contrast, in crossed ellipses coils, the position of the elbow of a patient tends to be misaligned due to the cramped space in the body cavity.

While the conductors forming the coils of assembly 26 are described as comprising flat conductors as commercially available in tape form, the conductors may be tubular or other cross section shapes of solid or hollow wires preferably made of copper. The coils of the present invention are particularly advantageous in comprising straight wires lying in planes for ease of visual manual alignment to the body coil structure while exhibiting minimized overall volume. The assembly is merely set in place by releasably placing the support 41 in the desired alignment. If alignment needs further adjustment, the support 41 is merely lifted from the patient table and reset in position. A further advantage over current linear surface coils is that the assembly 26 is rigid and therefore no preliminary shaping and associated tuning and matching procedure is required for each different patient, reducing examination time considerably.

What is claimed is:

1. A quadrature coil construction for use in an NMR imaging apparatus comprising:

first and second spaced U-shaped electrically conductive conductors each lying in respective first planes, the conductors each comprising a pair of spaced legs joined at one end by a transverse base member and having substantially the same orientation;

a pair of electrically conductive interconnect conductors, each connecting said first and second conductors at leg ends opposing the one end forming with said legs third and fourth U-shaped conductors lying in second planes oriented orthogonal to said first planes; and signal applying means connected to the base members and interconnect conductors for respectively forming with said members and interconnect conductors first and second sets of magnetically responsive coils having orthogonal orientations for operation in quadrature.

2. The coil construction of claim 1 wherein said legs and base members each define straight lines, the first and second conductors lying in parallel planes, said interconnect conductors defining a plane normal to said parallel planes.

3. The coil construction of claim 2 including a magnetic field transparent support structure for said U-shaped conductors and said interconnect conductors, said support structure comprising relatively rigid sheet material forming an object receiving cavity between said first and second conductors.

4. The coil construction of claim 3 wherein said support structure comprises first and second spaced parallel sheets for respectively supporting said first and second conductors, a third sheet normal to the first and second sheets for supporting said interconnect conductors and a fourth sheet for supporting said first and second sheets at the region of said base members, said sheets forming said cavity.

5. The coil construction of claim 4 wherein said first and second conductors have a given transverse width, said base members including said given widths having a given dimension, said interconnect conductors having a given length, said third sheet having a length of about said given length and a width of about said given dimension, said fourth sheet having a length of about said given length and a width of at most about two thirds said given dimension, said cavity for receiving a human wrist therein such that the third and fourth sheets align the received wrist somewhat centrally on a diagonal across said first and second conductors in a direction parallel to said first and second conductors.

6. The coil construction of claim 1 wherein said conductors include magnetic field transparent support means arranged to receive and align a human wrist between said first and second conductors on a diagonal parallel to and across the U of these conductors.

7. The coil construction of claim 6 wherein said legs are about 12 cm. long, said interconnect conductors are about 6 cm. long and said base members are about 8 cm. long.

8. The coil construction of claim 1 wherein said signal applying means includes radio frequency signal input/output means coupled to said interconnect conductors as a first radio frequency signal input/output means and to said base members as a second radio frequency signal input/output means.

9. A quadrature coil construction for use in an NMR imaging apparatus comprising:

first and second spaced U-shaped electrically conductive conductors lying in respective first spaced parallel planes and having substantially the same orientation, said conductors each having a pair of spaced legs and a base member interconnecting the legs at one end of each of the legs;

a pair of electrically conductive interconnect conductors, each connecting a leg of each said first and second conductors at an end of each leg opposing the one end to form with said legs third and fourth U-shaped conductors lying in respective second spaced parallel planes orthogonal to said first planes;

first radio frequency signal input/output means connected to the base members of said first and second conductors to form with said first and second conductors and said interconnect conductors a first set of coils of a given orientation, said second set being responsive to and for generating magnetic flux in a first direction in a first mode; and second radio frequency signal input/output means connected to said pair of interconnect conductors to form with said first and second conductors a second set of coils oriented normal to said given orientation, said second set being responsive to and for generating magnetic flux in a second direction orthogonal to the first direction in a second mode.

10. The construction of claim 9 including magnetic field transparent means for supporting said coils and forming therewith a rectangular space for receiving and aligning an object to be imaged between said first and second conductors.

11. The construction of claim 10 including a support member secured to said transparent means for releasably securing said construction to said apparatus.

12. The construction of claim 10 wherein said supporting means for said coils includes a rigid U-shaped member comprising a pair of sheet member legs supported at one end by a sheet member base member normal to said sheet member legs, said sheet member legs for respectively supporting said first and second conductors, said sheet member base mixer for supporting said interconnect conductors.

13. The construction of claim 10 wherein said conductors are flat conductive ribbons.

14. The coil of claim 10 wherein said supporting means for said coils includes sheet polycarbonate material.

15. The coil of claim 10 wherein said apparatus includes means for generating a magnetic field in a given orientation, said supporting means includes means for orienting said first and second sets of coils aligned with said given orientation.

16. A quadrature coil construction for use in an NMR imaging apparatus, said apparatus generating a magnetic field in a given orientation, said construction comprising:

first and second spaced rectangular U-shaped electrically conductive conductors lying in respective first spaced parallel planes and having substantially the same orientation, said conductors each having a pair of spaced legs and a base member interconnecting the legs at one end of each of the legs;

a pair of electrically conductive interconnect conductors, each connecting a leg of each said first and second conductors at an end of each leg opposing the one end to form with said legs third and fourth rectangular U-shaped conductors lying in respective second spaced parallel planes orthogonal to said first planes;

first radio frequency signal input/output means connected to the base members of said first and second conductors to form with said first and second conductors and said interconnect conductors a first set of spaced parallel coils each lying in a different one of said second parallel planes, said second set being responsive to and for generating magnetic flux in a first direction parallel to said first and second conductors in a first mode;

second radio frequency signal input/output means connected to said pair of interconnect conductors to form said first and second conductors into a second set of coils parallel to said first and second conductors, said second set being responsive to and for generating magnetic flux in a second direction orthogonal to the first direction in a second mode; and means for selectively applying said radio frequency signals to said first and second input/output means to produce a quadrature radio frequency signal manifesting an image of an object placed between said first and second conductors.

17. A quadrature coil system for use in NMR imaging comprising:

first and second U-shaped coils lying in parallel planes;

interconnect means for conductively connecting said coils to form therewith third and fourth U-shaped coils oriented orthogonal to said first and second coils; and means for applying radio frequency signals to said coils in quadrature and for receiving signals generated by said coils in response to sensing orthogonal magnetic fields.

18. The system of claim 17 wherein said coils comprise parallel and orthogonal conductors.

19. The system of claim 18 wherein said coils comprise conductors secured to support means forming a right angle polyhedron.

* * * * *